(12) United States Patent
Parekh et al.

(10) Patent No.: US 6,808,982 B2
(45) Date of Patent: *Oct. 26, 2004

(54) METHOD OF REDUCING ELECTRICAL SHORTS FROM THE BIT LINE TO THE CELL PLATE

(75) Inventors: Kunal R. Parekh, Boise, ID (US); Charles H. Dennison, Meridian, ID (US); Jeffrey W. Honeycutt, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 10/374,246

(22) Filed: Feb. 25, 2003

(65) Prior Publication Data

US 2003/0129800 A1 Jul. 10, 2003

Related U.S. Application Data

(63) Continuation of application No. 10/171,369, filed on Jun. 13, 2002, now Pat. No. 6,524,907, which is a continuation of application No. 09/399,592, filed on Sep. 20, 1999, now Pat. No. 6,468,859.

(51) Int. Cl.[7] .......................................... H01L 21/8242
(52) U.S. Cl. ...................................... 438/253; 438/254
(58) Field of Search ........................................ 435/253

(56) References Cited

U.S. PATENT DOCUMENTS

| | | | |
|---|---|---|---|
| 5,338,700 A | | 8/1994 | Dennison et al. |
| 5,563,089 A | | 10/1996 | Jost et al. |
| 5,686,747 A | | 11/1997 | Jost et al. |
| 5,763,306 A | | 6/1998 | Tsai |
| 5,821,140 A | | 10/1998 | Jost et al. |
| 5,946,568 A | | 8/1999 | Hsiao et al. |
| 6,124,626 A | | 9/2000 | Sandhu et al. |
| 6,162,737 A | * | 12/2000 | Weimer et al. ............ 438/738 |
| 6,200,855 B1 | | 3/2001 | Lee |
| 6,243,285 B1 | | 6/2001 | Kurth et al. |
| 6,274,423 B1 | | 8/2001 | Prall et al. |
| 6,300,667 B1 | * | 10/2001 | Miyamoto ................ 257/522 |
| 6,323,080 B1 | | 11/2001 | Parekh |
| 6,376,301 B2 | | 4/2002 | Parekh et al. |
| 6,399,982 B1 | | 6/2002 | Derderian et al. |
| 6,492,245 B1 | * | 12/2002 | Liu et al. ................ 438/422 |
| 6,524,907 B2 | * | 2/2003 | Parekh et al. ............. 438/253 |

* cited by examiner

Primary Examiner—David Nelms
Assistant Examiner—Thao P. Le
(74) Attorney, Agent, or Firm—TraskBritt

(57) ABSTRACT

A stress buffer and dopant barrier in the form of a Tetra-EthylOrthoSilicate (TEOS) film is deposited after the capacitor cell plate has been etched and cleaned to thereby eliminate electrical shorts from the bit line to the cell plate.

36 Claims, 10 Drawing Sheets

METHOD OF REDUCING ELECTRICAL SHORTS FROM THE BIT LINE TO THE CELL PLATE

CROSS-REFERENCE TO RELATED APPLICATIONS

This application is a continuation of application Ser. No. 10/171,369, filed Jun. 13, 2002, now U.S. Pat. No. 6,524,907, issued Feb. 25, 2003, which is a continuation of application Ser. No. 09/399,592, filed Sep. 20, 1999, now U.S. Pat. No. 6,468,859, issued Oct. 22, 2002.

BACKGROUND OF THE INVENTION

1. Field of the Invention

This invention relates generally to the formation of a bit line over a capacitor array of memory cells.

2. State of the Art

This invention was principally motivated in addressing problems and improvements in dynamic random access memory (DRAM). As DRAM increases in memory cell density, there is a continuing challenge to maintain sufficiently high storage capacitance despite decreasing cell area. Additionally, there is a continuing goal to further decrease cell area. One principal way of increasing cell capacitance is through cell structure techniques. Such techniques include three-dimensional cell capacitors, such as trenched or stacked capacitors. Yet as feature size continues to become smaller and smaller, development of improved materials for cell dielectrics, as well as the cell structure, is important.

Conventional stacked capacitor DRAM arrays utilize either a Capacitor Over Bit line (COB) or a Capacitor Under Bit line (CUB) construction. With a Capacitor Over Bit line construction, the bit line is provided in close vertical proximity to the bit line contact of the memory cell field effect transistor (FET), with the cell capacitors being formed over the top of the word line and bit line. With a Capacitor Under Bit line construction, a deep vertical bit line contact is made through a thick insulating layer to the source/drain region of the cell FET access transistor, with the capacitor construction being provided over the word line and under the bit line.

The present invention relates to a method of reducing electrical shorts between the bit contact and the capacitor cell plate in a Capacitor Under Bit line cell.

BRIEF SUMMARY OF THE INVENTION

The process of the present invention provides a method to prevent a short circuit between a capacitor cell plate and a conductive contact. The present invention provides for a capacitor structure having lower and upper conductive cell plates. The conductive cell plates are separated by a dielectric and the conductive cell plates and the dielectric have exposed edges. A layer of TEOS is disposed upon the wafer and about the capacitor structure. The TEOS layer encases the exposed edges of the conductive cell plates. A conductive contact structure is then provided adjacent the capacitor structure. The TEOS layer separates the capacitor structure and the conductive contact structure, thereby preventing the conductive structures from shorting together.

BRIEF DESCRIPTION OF THE SEVERAL VIEWS OF THE DRAWINGS

The present invention will be better understood from reading the following description of nonlimitative embodiments, with reference to the attached drawings, wherein.

DETAILED DESCRIPTION OF THE INVENTION

FIGS. 1–10 illustrate a technique for eliminating electrical shorts in a semiconductor device. It should be understood that the illustrations are not meant to be actual cross-sectional views of any particular semiconductor device, but are merely idealized representations which are employed to more clearly and fully depict the formation of the process of the present invention than would otherwise be possible.

Figure 1:
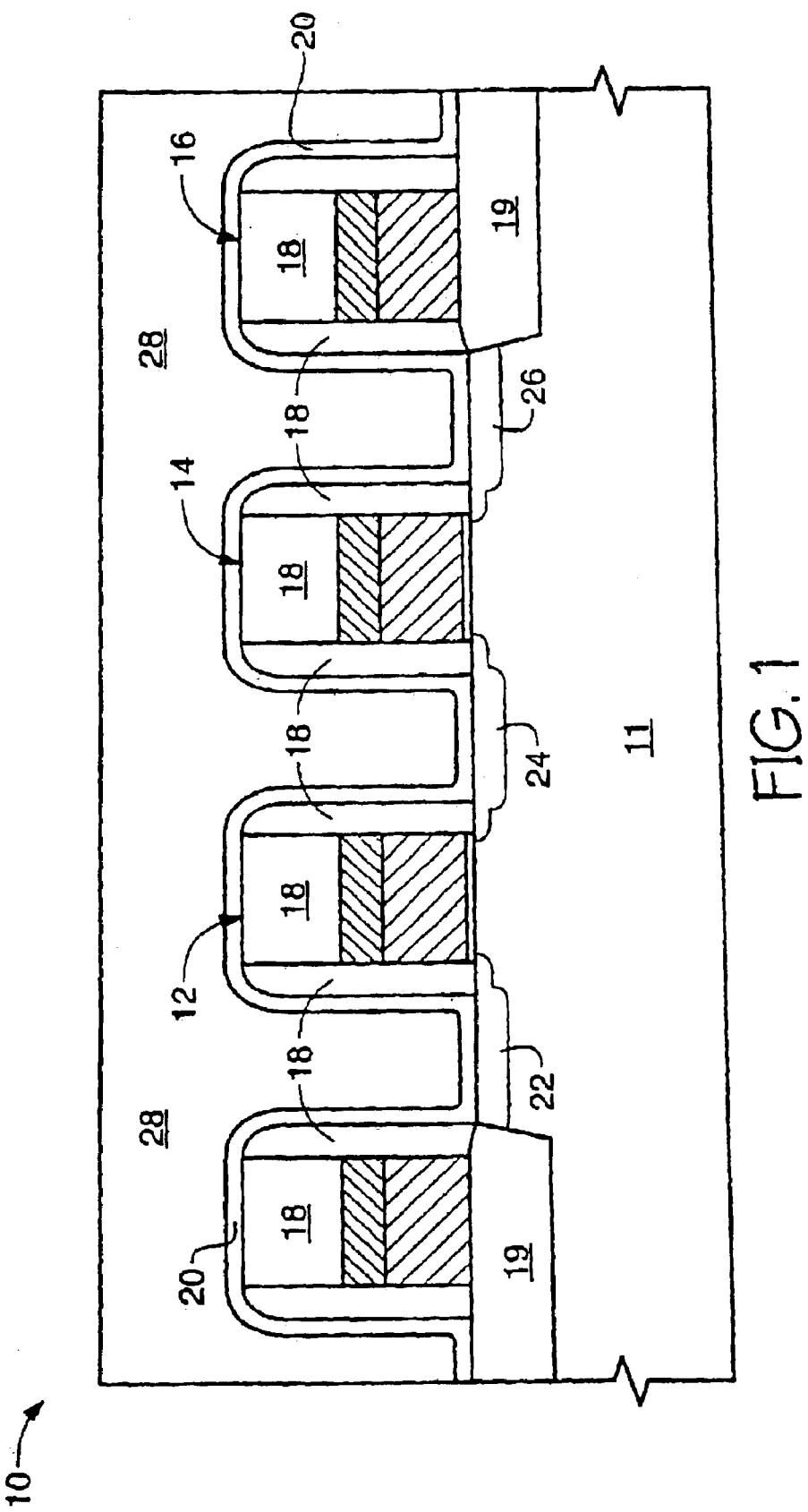
FIG. 1 is a schematic cross-section of a semiconductor wafer fragment, in accordance with the process of the present invention.

Referring to FIG. 1, a semiconductor wafer fragment is indicated generally as a wafer 10. Wafer 10 is defined in part by a silicon semiconductor substrate 11. In the semiconductor industry, a "substrate" refers to one or more semiconductor layers or structures, which includes active or operable portions of semiconductor devices. In the context of this document, the term "semiconductor substrate" is defined to mean any construction comprising semiconductive material including, but not limited to, bulk semiconductive material, such as a semiconductive substrate, either alone or in assemblies comprising other materials thereon, and semiconductive material layers, either alone or in assemblies comprising other materials. The term "substrate" refers to any supporting structure including, but not limited to, the semiconductive substrates described above.

Wafer 10 has been provided with an array of substantially electrically isolated word lines, such as the illustrated word lines 12, 14, and 16. Such word lines are of a conventional construction having a lowermost gate oxide, a lower polysilicon layer, an overlying silicide layer such as tungsten silicide, and insulating caps 18 and side insulating spacers. Such spacers and caps 18 preferably comprise an insulative nitride, such as $Si_3N_4$. A thin layer 20 of $Si_3N_4$ or TetraEthylOrthoSilicate (TEOS) is provided atop the wafer to function as a diffusion barrier for subsequent BoroPhosoSilicate Glass (BPSG) deposition. Layer 20 has a thickness preferably from about 100 Angstroms to about 250 Angstroms.

Active areas are provided about the word lines, such as active regions 22, 24, and 26, to define an array of memory cell FETs. The discussion proceeds with reference to FETs formed using word lines 12 and 14, which would be provided with a capacitor construction for definition of two memory cells which share the same bit line contact. Active regions 22 and 26 define first active regions for electrical connection with a memory cell capacitor (described below). Active region 24 defines a second active region for electrical connection with a bit line (described below). Field oxide 19 is provided, as shown.

A first insulating layer 28 is provided over the word lines and active areas. An example material is BoroPhosphoSilicate Glass (BPSG), with an example deposition thickness being between 15,000 and 20,000 Angstroms. Preferably, as shown, layer 28 is subsequently planarized by chemical-mechanical polishing (CMP) to an elevation of from about 2,000 Angstroms to about 8,000 Angstroms above the word line nitride caps 18.

Figure 2:
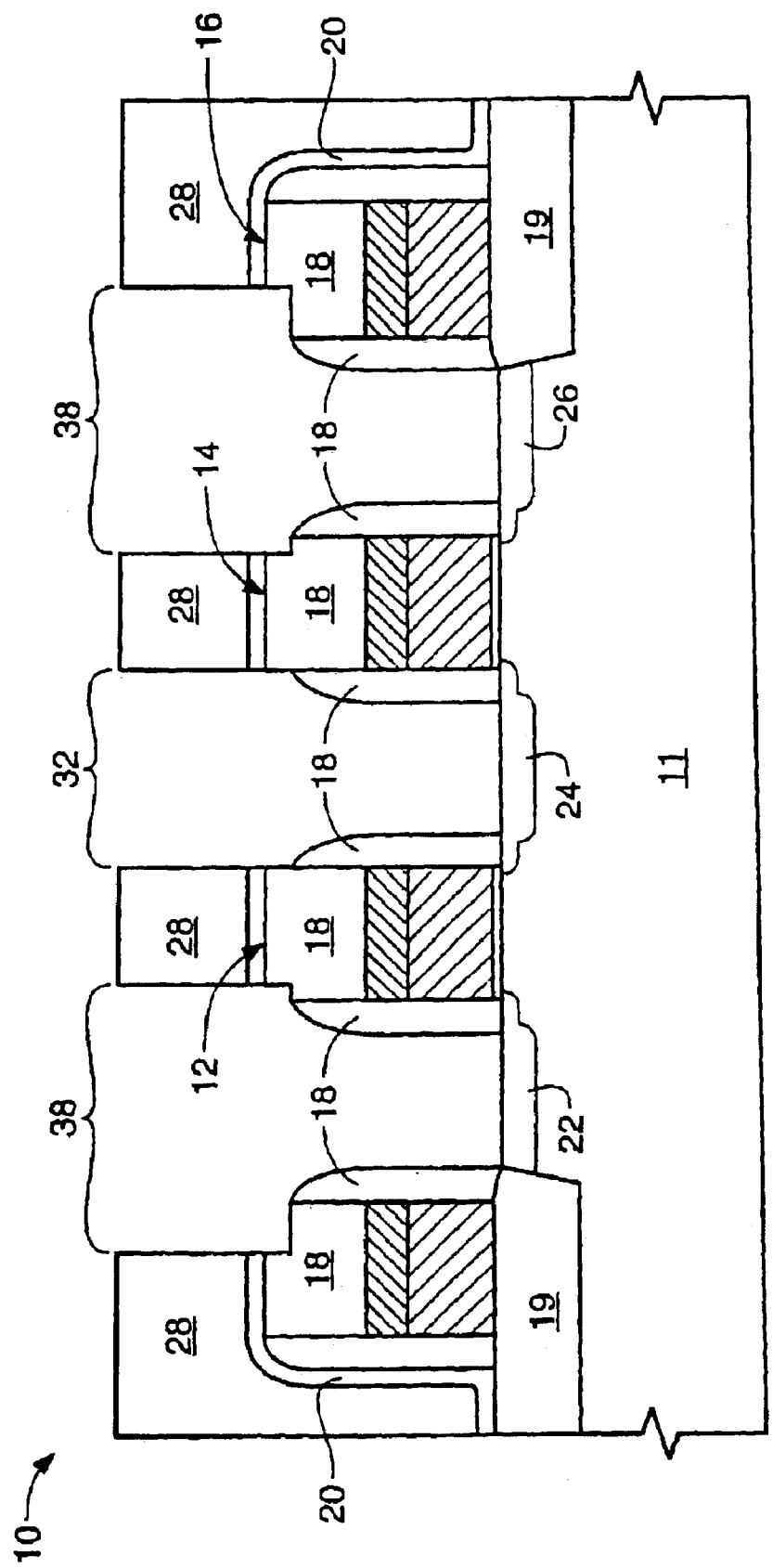
FIG. 2 is a schematic cross-section of the semiconductor wafer fragment, in accordance with the process of the present invention.

Referring to FIG. 2, a series of first contact openings 38 and second contact openings 32 are provided through first insulating layer 28 to first active regions 22 and 26 and second active region 24, respectively. Selective photomasking and dry chemical etching of BPSG selectively relative to nitride would typically form such contact openings. An example etch chemistry would include $CHF_3$ and $O_2$ at low $O_2$ flow rate (i.e., less than 5% $O_2$ by volume in a $CHF_3/O_2$ mixture), or the combination of $CF_4$, Argon, $CH_2F_2$ and $CHF_3$.

Thereafter, a selective etch of the wafer is conducted to etch nitride layer 20 or TEOS relative to underlying silicon substrate 11 to upwardly expose active regions 22, 24 and 26. The principal purpose of the nitride or TEOS layer 20 is to prevent diffusion of boron or phosphorous atoms from first insulating layer 28 into active areas 22, 24 and 26. Caps 18 are preferably comprised of a nitride ($Si_3N_4$) and layer 28 comprised of an oxide, such that the contact etch to produce contact openings 32 and 38 will stop relative to word line spacers and caps 18.

Figure 3:
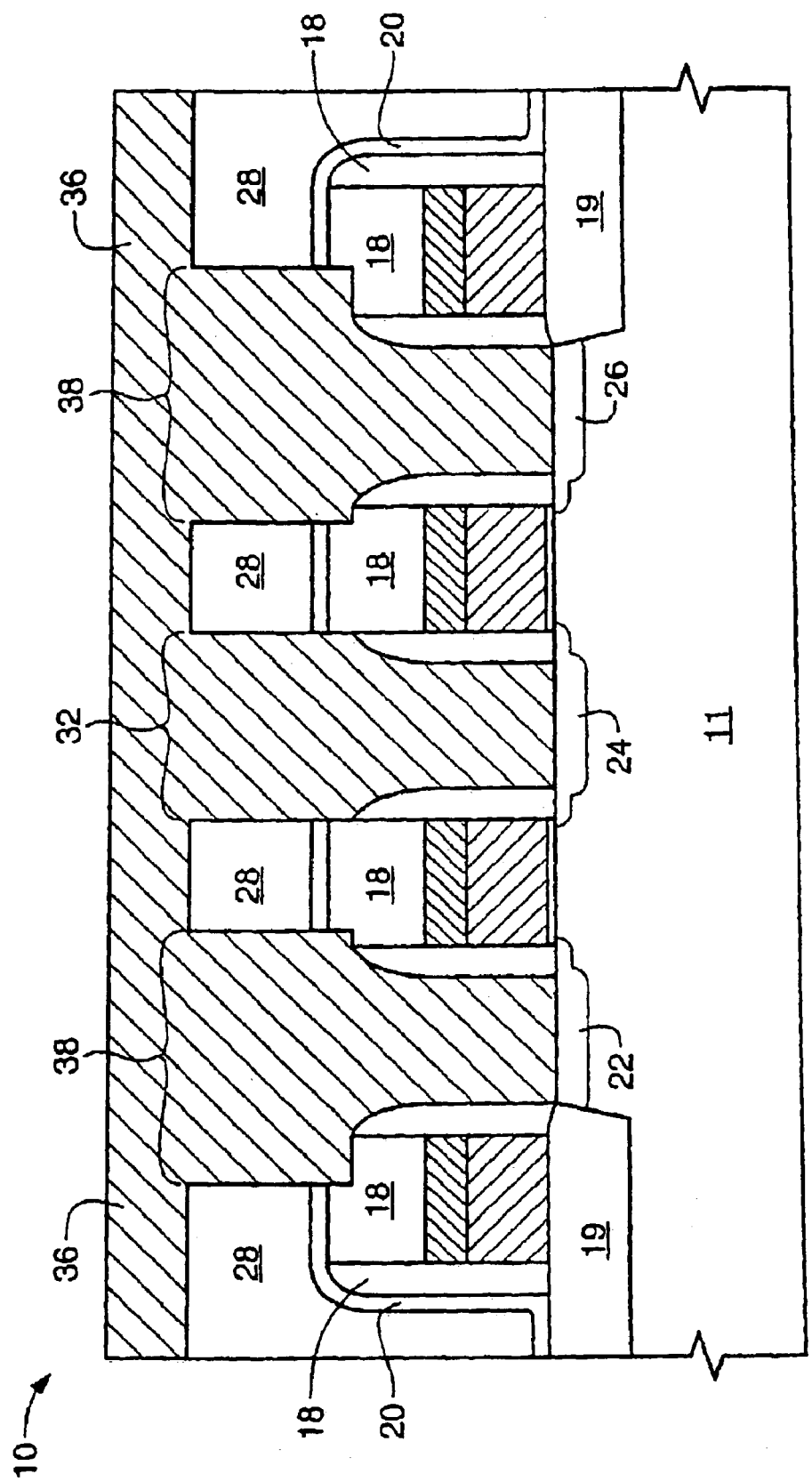
FIG. 3 is a schematic cross-section-of the semiconductor wafer fragment, in accordance with the process of the present invention.
Figure 4:
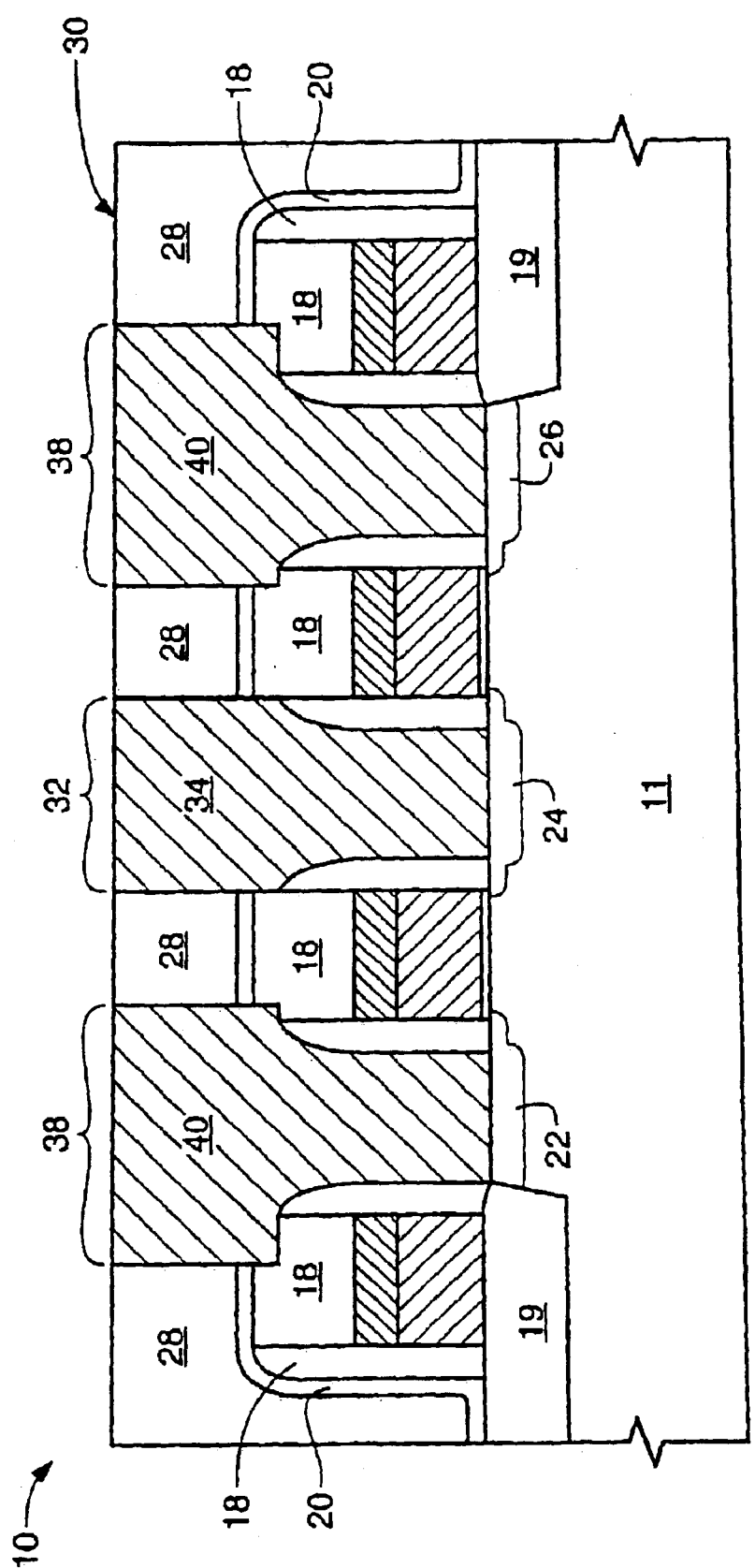
FIG. 4 is a schematic cross-section of the semiconductor wafer fragment, in accordance with the process of the present invention.

In accordance with the invention, buried capacitor contact openings/containers 38 and associated pillars 40 can be provided along with the bit line contact openings 32 and pillars 34, as seen in FIGS. 3 and 4. A first layer of electrically conductive material 36 is provided over insulating material layer 28 to within first contact opening 38 and second contact opening 32 to electrically connect with first and second active regions 22, 26 and 24, respectively. First layer 36 is deposited to a thickness which fills first contact opening 38 and second contact opening 32. An example diameter for contact openings 32 and 38 is 0.2–0.25 micron. In such instance, an example preferred thickness of first layer 36 is less than 2,000 Angstroms, which is sufficient to fill the contact openings 32, 38. An example and preferred material for first layer 36 is in situ N+ doped polysilicon.

Wafer fragment 10 is planarized and etched downwardly at least to upper surface 30 of insulating material 28 to remove conductive material layer 36 thereabove. This will isolate first layer conductive material 36 within contact openings 32 and 38. Such planarized etching can be conducted by plasma etchback or by chemical-mechanical polishing.

Figure 5:
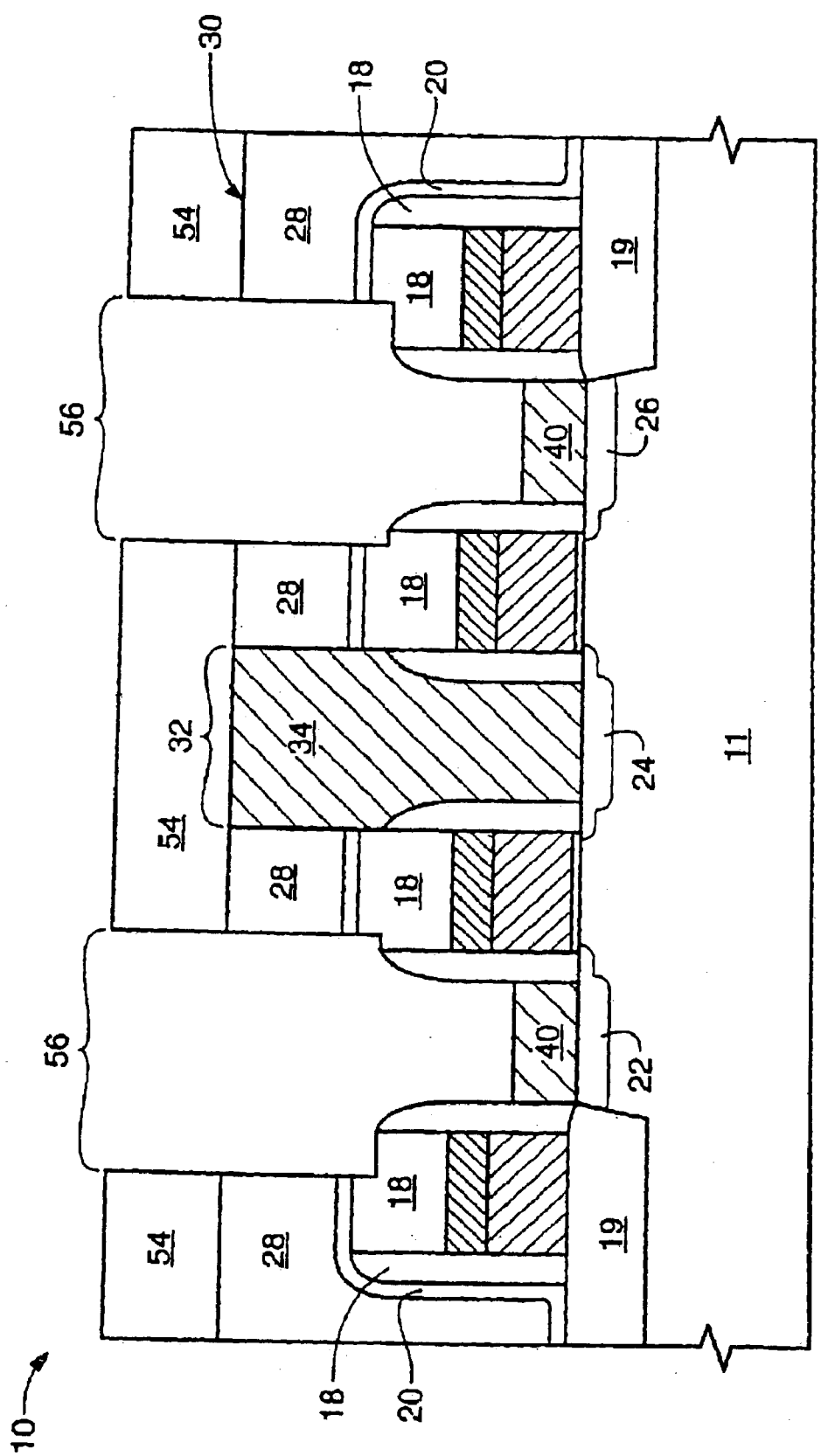
FIG. 5 is a schematic cross-section of the semiconductor wafer fragment, in accordance with the process of the present invention.

Referring to FIG. 5, the conductive material layer 36 within first contact opening 38 can be recessed further, to a level below upper surface 30 of insulating layer 28. A capacitor structure is formed at this location, as discussed below.

A layer of insulating material 54 is provided atop wafer 10. An example and preferred material for layer 54 is BPSG deposited to a thickness of approximately 10,000 Angstroms. Capacitor contact openings 56 are provided through insulating layer 54 to allow electrical connection with first active regions 22 and 26, through pillars 40.

Figure 6:
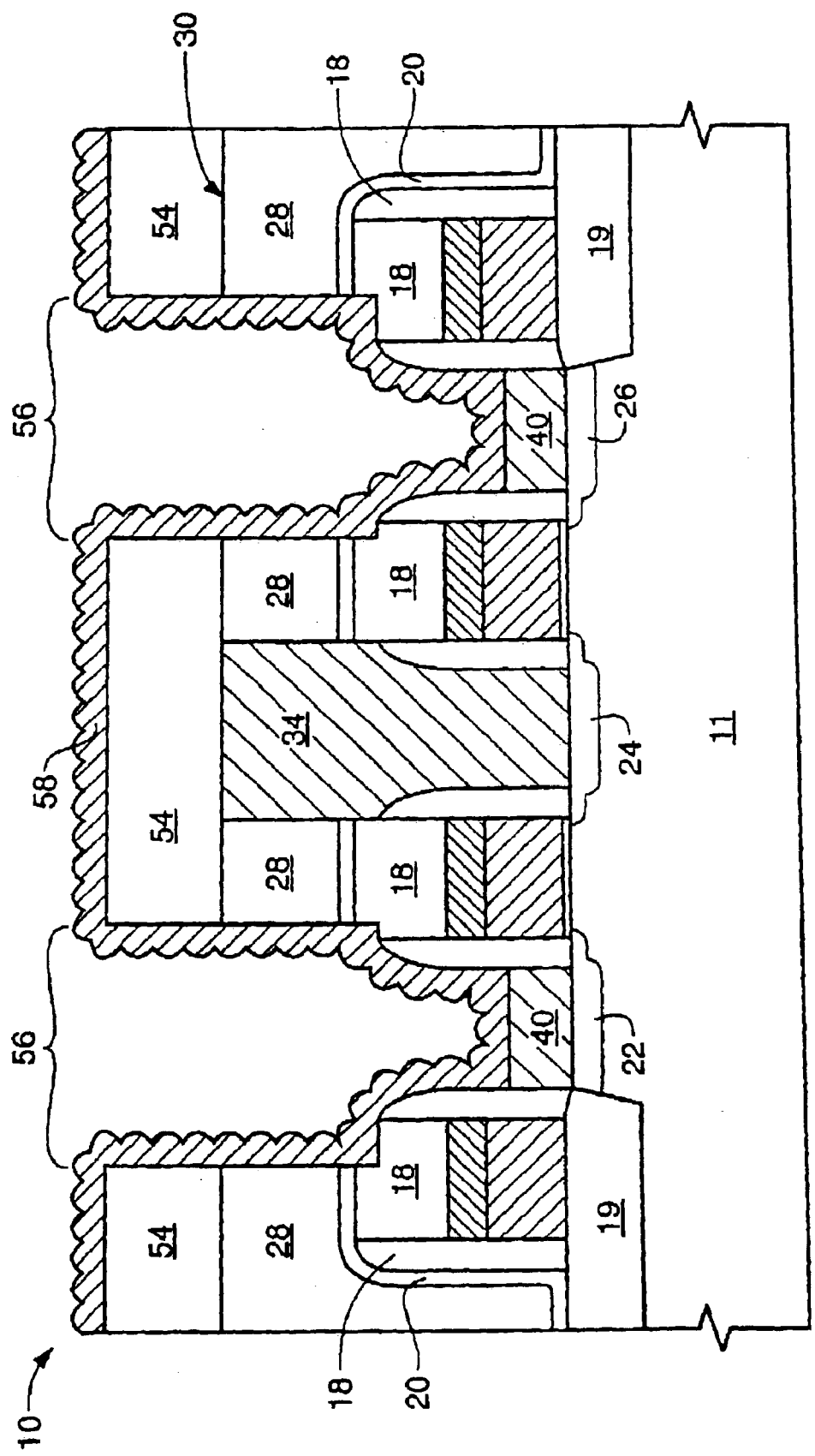
FIG. 6 is a schematic cross-section of the semiconductor wafer fragment, in accordance with the process of the present invention.

Referring to FIG. 6, a conductive material layer 58 is provided over insulating layer 54 and within capacitor contact opening 56. Conductive material layer 58 preferably comprises a storage node or storage container made from in situ phosphorous-doped HemiSpherical Grain (HSG) polysilicon.

Figure 7:
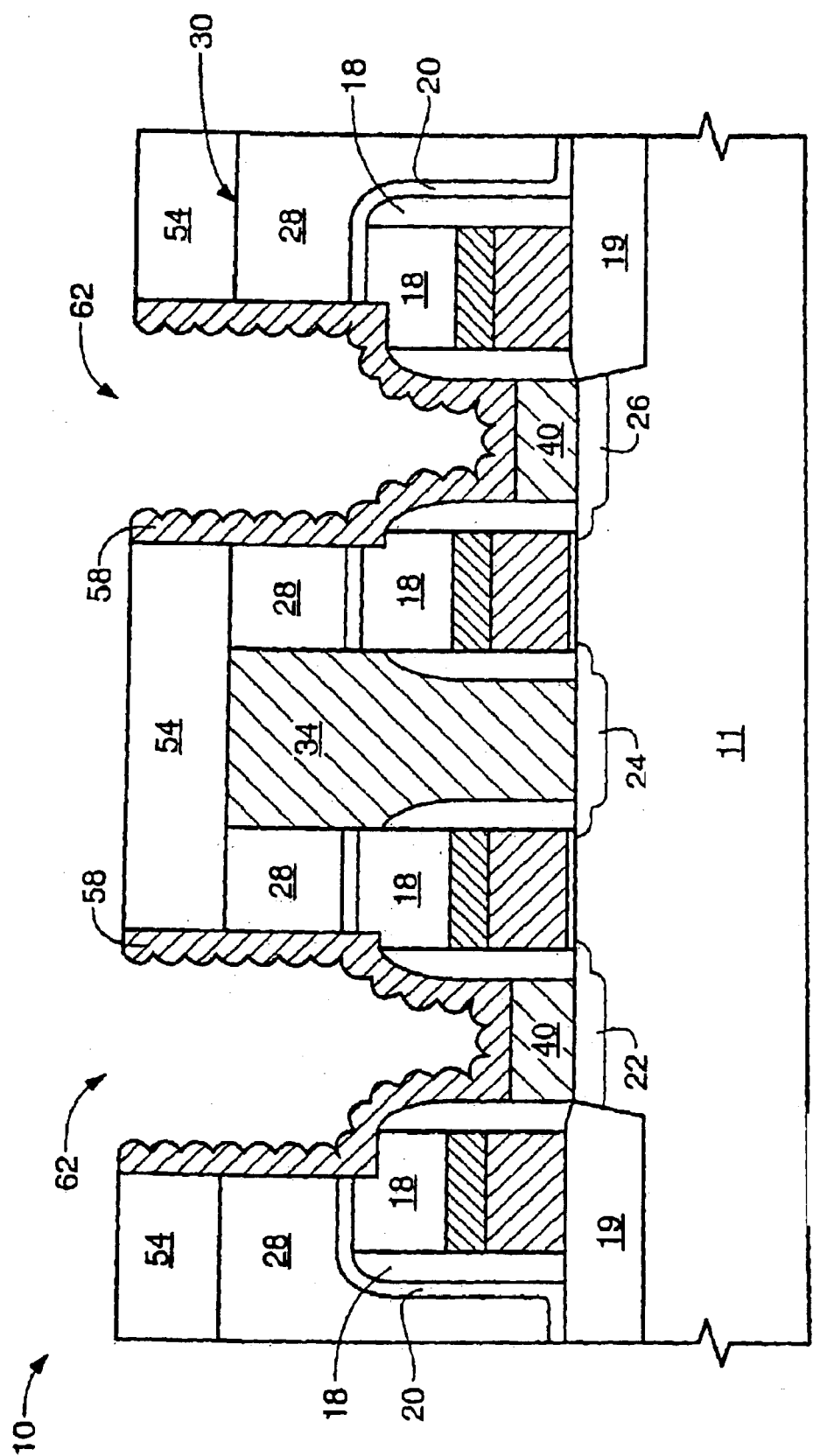
FIG. 7 is a schematic cross-section of the semiconductor wafer fragment, in accordance with the process of the present invention.

Referring to FIG. 7, CMP is preferably used to remove the conductive material layer 58 which is disposed atop insulating layer 54, thereby defining isolated storage node containers 62 (see FIG. 7). The storage node containers 62 are electrically connected to first active regions 22 and 26 through pillars 40.

Figure 8:
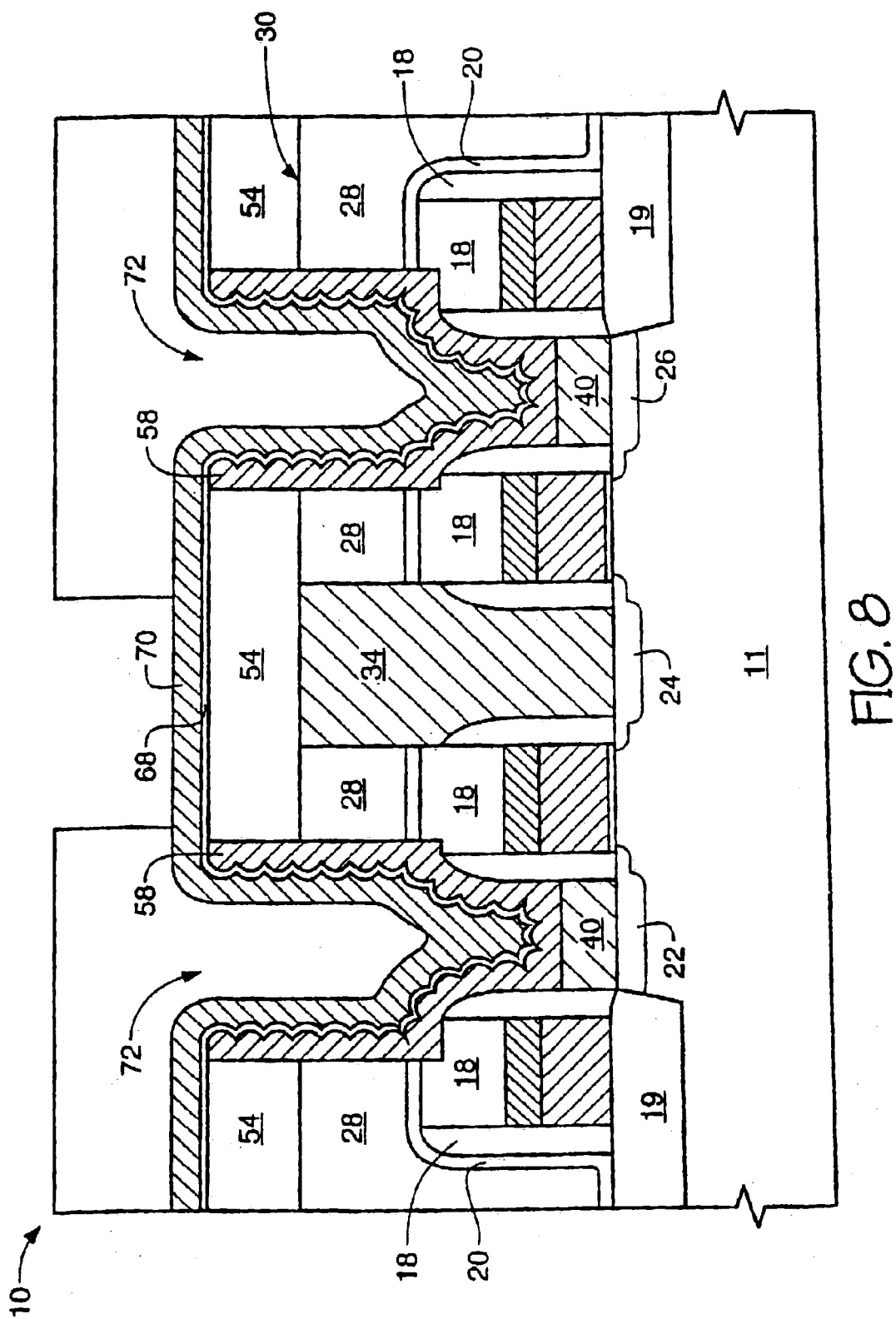
FIG. 8 is a schematic cross-section of the semiconductor wafer fragment, in accordance with the process of the present invention.

Referring to FIG. 8, a conventional or other suitable capacitor cell dielectric layer 68, such as a cell nitride layer, is conformally deposited on the wafer 10 atop isolated storage node containers 62. Specifically, insulating layer 54 is interposed between the upper surface of pillar 34 and the capacitor cell dielectric layer 68.

A conductive capacitor cell layer 70, such as cell plate, is provided atop the capacitor cell dielectric layer 68, thereby defining an array of memory cell capacitors 72 on the wafer 10. Individual memory cell capacitors, such as the illustrated capacitors 72, of the array are thus provided within the capacitor contact openings and are defined by an outwardly projecting container structure. Cell layer 70 preferably comprises in situ phosphorous-doped polysilicon and functions as a capacitor cell plate.

Figure 9:
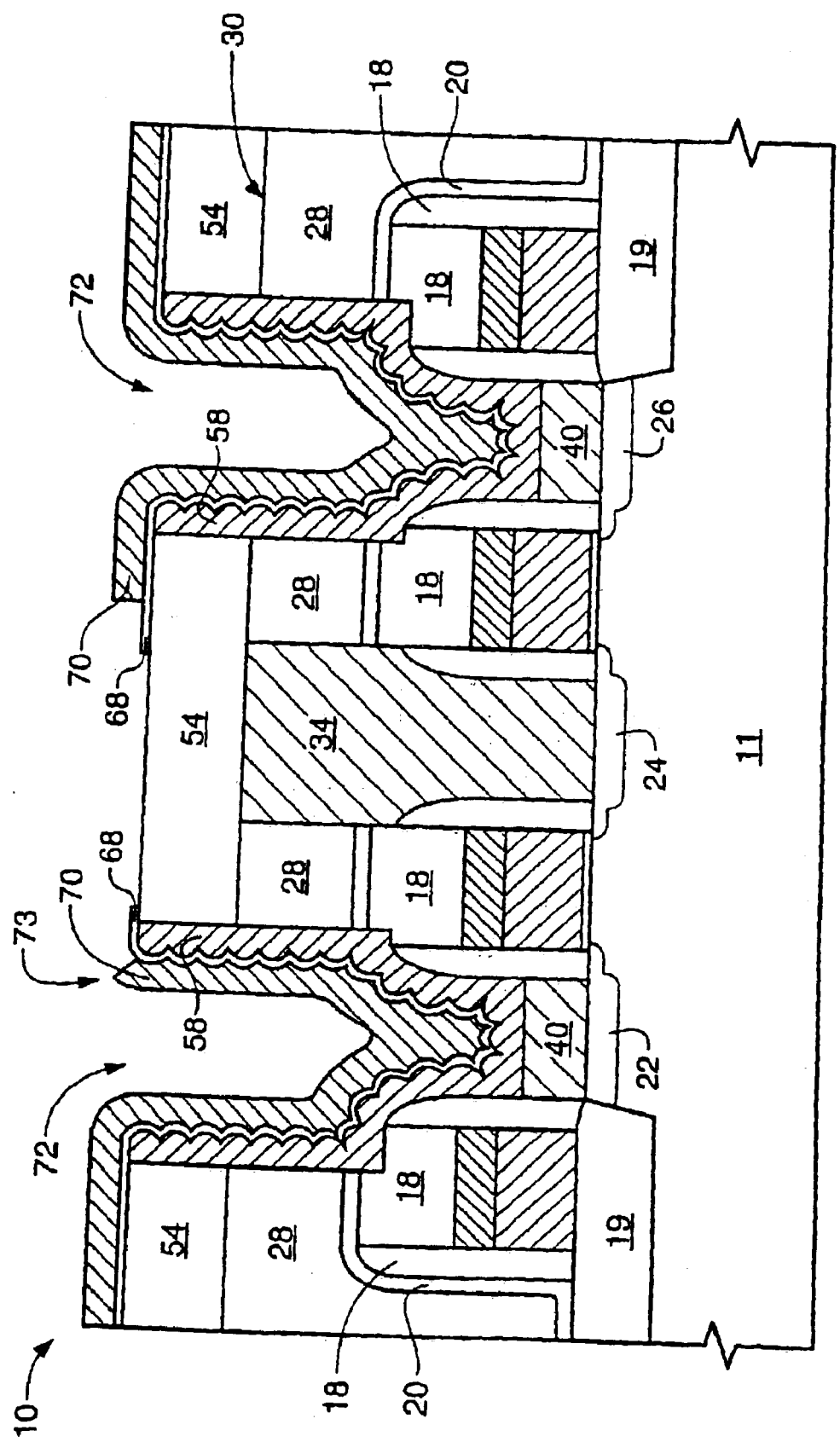
FIG. 9 is a schematic cross-section of the semiconductor wafer fragment, in accordance with the process of the present invention.

Referring to FIG. 9, cell layer 70 is then photopatterned with a layer of resist, which is intentionally illustrated herein with misalignment to account for the worst case scenario in a manufacturing environment. The misalignment will make the benefits of the present invention more apparent. Alternatively, an antireflective coating is added prior to photopatterning to assist in photolithography resolution. Subsequently, layers 68 and 70 are etched together.

The etch of the cell layer 70 has an isotropic component, i.e., the etch proceeds in both horizontal and vertical directions at relatively the same rate. The polysilicon layer that comprises cell layer 70 is selectively etchable with respect to the cell nitride layer 68. Hence, the cell nitride layer 68 is not etched at the same rate and an overetch of the cell layer 70 results in an undercut profile. One consequence of the undercut of cell layer 70 is that, with a worst case scenario, photolithography may result in a misalignment edge 73, as seen in FIG. 9, wherein the cell layer 70 is isotropically etched back past the upper edge of the conductive material layer 58.

Figure 10:
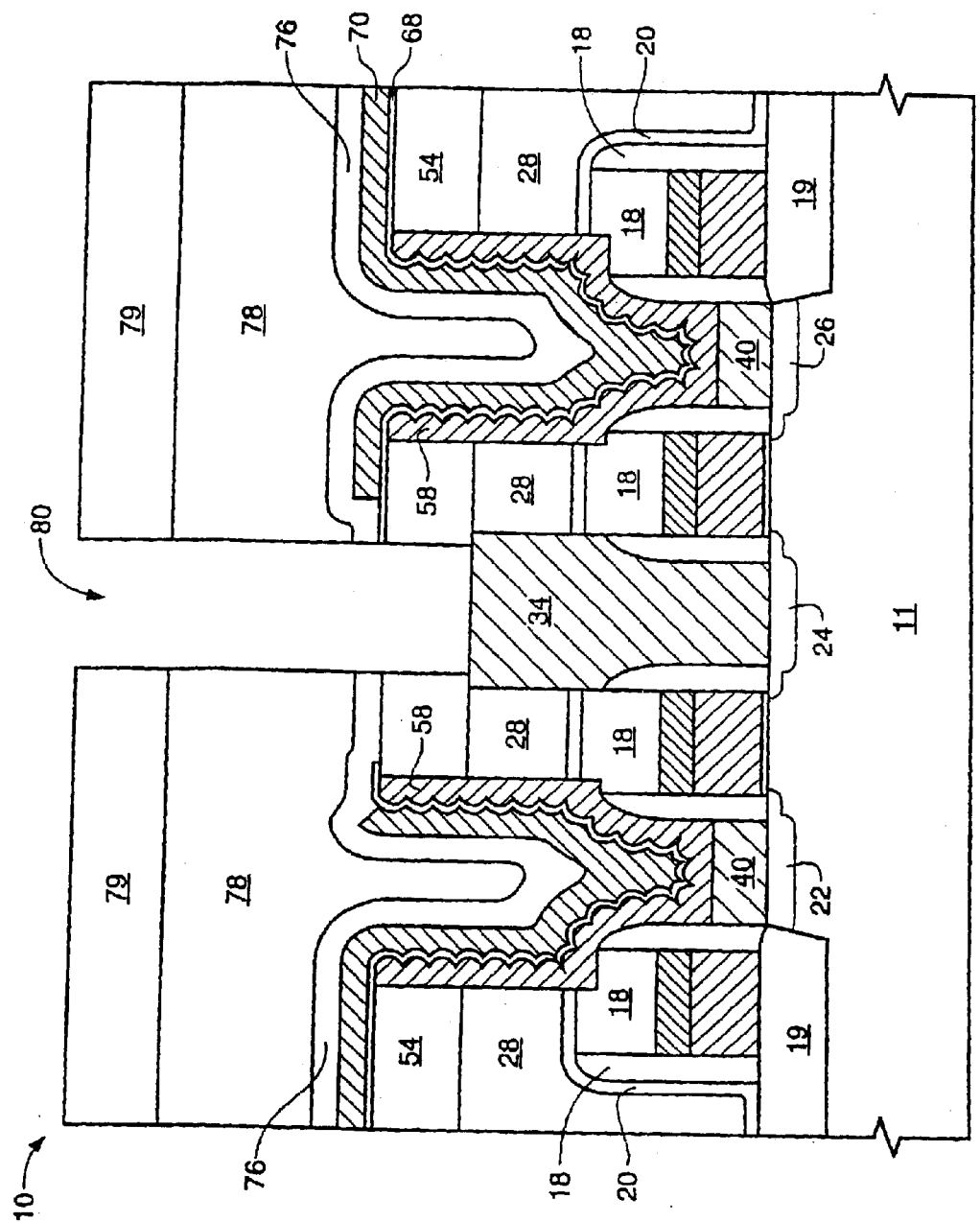
FIG. 10 is a schematic cross-section of the semiconductor wafer fragment, in accordance with the process of the present invention.

One reason for undercutting into the cell layer 70 is to provide more of a process margin for the future bit line contact opening 80 (see FIG. 10). The undercut profile helps to prevent the conductive polysilicon which forms cell layer 70 from projecting into the bit line contact opening 80 and thereby causing a short. This potential short is an increasing problem as the geometries of the DRAM cell become smaller and smaller. Therefore, one advantage of this step is an increased bit line contact opening 80 to cell layer 70 space and hence, a method to isolate the conductive edges of cell layer 70.

However, the corresponding disadvantage is that the cell layer 70 is etched past the conductive material layer 58, which leads to a low-level defect density of current leakage between the conductive material layer 58 and cell layer 70 at the misalignment edge 73. This current leakage results in loss of stored charge in the DRAM cell, which leads to data retention errors. Additionally, the loss of stored charge may be aggravated by possible damage of the exposed cell dielectric layer 68 in the misalignment edge 73 or region.

As shown in FIG. 10, an electrically insulative layer 76, such as TEOS, is blanket deposited atop the wafer 10 (and, therefore, covers cell layer 70) to a thickness from about 150 Angstroms to about 1,500 Angstroms, preferably 500 Angstroms. The purpose of such a layer 76 is to cover both the exposed corner of the conductive material layer 58 and any damaged cell nitride layer 68. Further, the blanket TEOS film or layer 76 is superior to the use of a nitride film as it also allows hydrogen to diffuse through it and, consequently, does not prevent passivation by hydrogen of the FETs during alloy.

Continuing the process flow, FIG. 10 illustrates a layer of insulating material 78 overlying the electrically insulative layer 76 or barrier layer and underlying layers and capacitor structures 72. The insulating material 78 is preferably comprised of a BPSG layer 78. Alternatively, a deposited anti-reflective coating (not shown) may be added atop the BPSG layer 78 for increased photolithography resolution. The wafer 10 is coated with a layer of resist 79 and patterned.

Preliminary bit line contact openings 80 are provided through overlying BPSG layer 78, TEOS layer 76 and second BPSG layer 54 down to the pillar 34. The anisotropic plasma etch used to produce contact opening 80 is followed by a pre-metal clean, also known as a wet etch as oxide material is isotropically removed. The pre-metal clean/wet etch removes any anti-reflective coating (DARC) remaining on the top surface of the BPSG layer 78 and cleans the bottom of the contact opening 80.

Typically, the process incidentally would move out laterally when the wet etch process hits the cell nitride layer 68. However, the TEOS film 76 deposited atop of the wafer 10 after the cell layer 70 has been etched serves to substantially eliminate any preferential wet etching along the seam of the cell nitride layer 68 and BPSG layer 78, which would occur if the TEOS layer 76 had not been deposited.

Without the TEOS layer 76, when the pre-metal clean/wet etch hits the cell nitride layer 68, an enhanced etch rate would occur along the interface with the BPSG layer 78. This enhanced etch rate is due to stress and dopant "pile-up" from the BPSG layer 78 and out-diffusion from the heavily doped exposed cell layer 70. Higher out-diffusion and higher phosphorous concentration from the exposed cell layer 70 leads to an enhanced wet etch rate. This will be exacerbated by subsequent wet cleans prior to contact metal deposition, which can ultimately lead to bit contact-to-cell layer 70 shorts.

The presence of the TEOS layer 76 moves the stress away from the nitride/BPSG interface to the TEOS/BPSG interface. The result is that the cell layer 70 is no longer exposed during the pre-metal clean/wet etch. The TEOS film 76 prevents dopant mixing or "pile up" (an increase in the concentration of dopants in a particular location). Thus, the TEOS layer 76 provides a stress buffer and dopant barrier in the form of a TEOS film that is deposited after the capacitor cell layer 70 is etched and cleaned.

The addition of a TEOS film 76 buffers the stress as well as eliminates dopant mixing between the highly phosphorous doped polycrystalline silicon forming the capacitor cell layer 70 and the heavily doped BPSG layer 78 and, therefore, provides a method of reducing stress-induced wet etching along the BPSG/nitride interface in a DRAM capacitor to eliminate bit contact-to-contact cell layer 70 shorting.

Subsequently, a digit line layer, such as metal or conductively doped polysilicon, is provided atop the wafer 10 and within the complete bit line contact openings 80, and thus electrically connects with pillar 34 for establishing electrical connection with active region 24.

While the particular process as herein shown and disclosed in detail is fully capable of obtaining the objects and advantages hereinbefore stated, it is to be understood that it is merely illustrative of the presently preferred embodiments of the invention and that no limitations are intended to the details of construction or design herein shown other than as described in the appended claims.

One having ordinary skill in the art will realize that even though a DRAM was used as the illustrative example, the process is equally applicable to other semiconductor devices.

What is claimed is:

1. A method of preventing short circuiting between a capacitor structure and a conductive contact, comprising:
   providing a capacitor structure disposed on a semiconductor substrate, said capacitor structure including a storage node, a dielectric layer overlying said storage node and a conductive layer overlying said dielectric layer;
   removing part of said dielectric layer and said conductive layer using an isotropic component such that each of said dielectric layer and said conductive layer include a misaligned end portion;
   depositing a layer of TEOS over said capacitor structure after said removing, such that said TEOS layer envelops the end portion of said dielectric layer and the end portion of said conductive layer; and
   forming a conductive contact adjacent said end portion of said dielectric layer and said end portion of said conductive layer of said capacitor structure such that said layer of TEOS separates said conductive contact and said capacitor structure.

2. The method of claim 1, further comprising overlying said semiconductor substrate with a heavily doped dielectric material.

3. The method of claim 1, wherein said providing said capacitor structure comprises providing a container-shaped capacitor structure.

4. The method of claim 1, wherein said providing comprises providing said capacitor structure with a doped conductive layer comprising a hemispherical grained polysilicon.

5. The method of claim 1, wherein said providing comprises providing said capacitor structure with a doped conductive layer comprising a doped polysilicon.

6. The method of claim 1, wherein said providing a capacitor structure further comprises providing a nitride or TEOS layer between an insulating layer and active regions of said semiconductor substrate.

7. The method of claim 1, further comprising forming a layer of insulative material on said layer of TEOS.

8. The method of claim 7, wherein said insulative material comprises BPSG.

9. The method of claim 1, wherein said depositing a layer of TEOS over said capacitor structure comprises depositing said layer of TEOS on a highly doped polycrystalline layer of said capacitor structure.

10. The method of claim 1, wherein said depositing a layer of TEOS comprises forming a layer of TEOS having a thickness of between 150 Å and about 1,500 Å.

11. The method of claim 10, wherein said depositing a layer of TEOS comprises forming a layer of TEOS having a thickness of about 500 Å.

12. A method of forming a DRAM circuit comprising:
providing a substrate having a plurality of field effect transistors thereon;
forming at least one contact adjacent a field effect transistor of said plurality of field effect transistors;
creating a capacitor in electrical contact with a first contact of said at least one contact, said capacitor comprising a conductive layer disposed over a nitride layer, said conductive layer and said nitride layer each having an edge;
disposing a first insulative layer over at least said capacitor so that said first insulative layer envelops said edges of said conductive layer and said nitride layer; and
forming a conductive contact adjacent said capacitor such that said edge of said nitride layer extends closer to said conductive contact than said edge of said conductive layer, said first insulative layer separating said capacitor and said conductive contact.

13. The method of claim 12, further comprising disposing a heavily doped dielectric material over said substrate.

14. The method of claim 12, wherein said creating a capacitor further comprises removing portions of said conductive layer and said nitride layer to form said edges thereof and said forming a conductive contact further comprises removing a portion of said first insulative layer adjacent said capacitor.

15. The method of claim 12, wherein said forming comprises layering a conductive material to form said conductive contact adjacent said capacitor.

16. The method of claim 12, wherein said creating said capacitor comprises creating a container-shaped capacitor.

17. The method of claim 12, wherein said creating comprises forming said conductive layer comprising a doped conductive layer including a hemispherical grained polysilicon.

18. The method of claim 12, wherein said creating a capacitor comprises creating said conductive layer comprising a doped conductive layer including a doped polysilicon.

19. The method of claim 12, wherein said creating further comprises providing a storage node having an edge proximate said conductive contact under said nitride layer such that said edge of said storage node is closer to said conductive contact than said edge of said conductive layer.

20. The method of claim 12, wherein said creating said capacitor comprises creating said capacitor in a container configuration.

21. The method of claim 12, wherein said disposing said first insulative layer comprises conformally depositing a TEOS layer over said at least said capacitor.

22. The method of claim 12, further comprising forming a second insulative layer on said first insulative layer.

23. The method of claim 22, wherein said second insulative layer comprises BPSG.

24. The method of claim 23, wherein said forming further comprises etching bit line contacts for said conductive contact through said first insulative layer and said BPSG layer.

25. The method of claim 12, wherein said creating a capacitor comprises forming a heavily doped conductive layer on said nitride layer.

26. A method of reducing cell plate leakage in a memory cell comprising:
providing a semiconductor substrate;
forming at least one capacitor structure over said semiconductor substrate, said at least one capacitor structure including a first doped conductive layer, a dielectric layer overlying said first doped conductive layer, and a second doped conductive layer overlying said dielectric layer;
etching a bit line contact opening adjacent said at least one capacitor structure using an isotropic component such that edges are formed on said dielectric layer and said second doped conductive layer;
depositing a TEOS layer over at least said at least one capacitor structure and enveloping said edges of said dielectric layer and said second doped conductive layer; and
forming a conductive contact in said bit line contact opening so that said TEOS layer separates said at least one capacitor structure and said conductive contact.

27. The method of claim 26, further comprising overlying said semiconductor substrate with a heavily doped dielectric material.

28. The method of claim 26, wherein said forming comprises layering a conductive material to fill said bit line contact opening.

29. The method of claim 26, wherein said forming said at least one capacitor structure comprises forming a container-shaped capacitor structure.

30. The method of claim 26, wherein said first doped conductive layer comprises a hemispherical grained polysilicon.

31. The method of claim 26, wherein said second doped conductive layer comprises a doped polysilicon.

32. The method of claim 26, wherein said forming comprises forming a nitride or TEOS layer between active regions of said semiconductor substrate and said first doped conductive layer.

33. The method of claim 26, further comprising forming a layer of insulative material on said TEOS layer.

34. The method of claim 33, wherein said insulative material comprises BPSG.

35. The method of claim 26, wherein said depositing said TEOS layer comprises forming a layer of TEOS having a thickness of between 150 Å and about 1,500 Å.

36. The method of claim 35, wherein said depositing said TEOS layer comprises forming a layer of TEOS having a thickness of about 500 Å.

* * * * *

UNITED STATES PATENT AND TRADEMARK OFFICE
CERTIFICATE OF CORRECTION

PATENT NO. : 6,808,982 B2  Page 1 of 1
APPLICATION NO. : 10/374246
DATED : October 26, 2004
INVENTOR(S) : Kunal R. Parekh, Charles H. Dennison and Jeffrey W. Honeycutt It is certified that error appears in the above-identified patent and that said Letters Patent is hereby corrected as shown below:

In the specification:

| | | |
|---|---|---|
| COLUMN 4, | LINE 49, | change "cell nitride layer 68." to --cell dielectric layer 68.-- and change "cell nitride layer 68" to --cell dielectric layer 68-- |
| COLUMN 5, | LINE 16, | change "cell nitride layer 68." to --cell dielectric layer 68.-- |
| COLUMN 5, | LINE 40, | change "cell nitride layer 68." to --cell dielectric layer 68.-- |
| COLUMN 5, | LINE 44, | change "cell nitride layer 68" to --cell dielectric layer 68-- |
| COLUMN 5, | LINE 47, | change "cell nitride layer 68," to --cell dielectric layer 68,-- |

Signed and Sealed this

Eighteenth Day of March, 2008

JON W. DUDAS
*Director of the United States Patent and Trademark Office*